US011362312B2

(12) United States Patent
Ye (10) Patent No.: US 11,362,312 B2
(45) Date of Patent: Jun. 14, 2022

(54) OLED DISPLAY SCREEN HAVING OPENING CORRESPONDING TO CAMERA MODULE AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Jian Ye, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 449 days.

(21) Appl. No.: 16/471,810

(22) PCT Filed: Mar. 26, 2019

(86) PCT No.: PCT/CN2019/079635
§ 371 (c)(1),
(2) Date: Jun. 20, 2019

(87) PCT Pub. No.: WO2020/155347
PCT Pub. Date: Aug. 6, 2020

(65) Prior Publication Data
US 2021/0359281 A1    Nov. 18, 2021

(30) Foreign Application Priority Data

Jan. 29, 2019    (CN) .......................... 201910087672.3

(51) Int. Cl.
*H01L 51/56*    (2006.01)
*H01L 27/32*    (2006.01)
(Continued)

(52) U.S. Cl.
CPC .......... *H01L 51/56* (2013.01); *H01L 27/3244* (2013.01); *H01L 51/001* (2013.01);
(Continued)

(58) Field of Classification Search
CPC combination set(s) only.
See application file for complete search history.

(56) References Cited

U.S. PATENT DOCUMENTS

| 2020/0035766 | A1* | 1/2020 | Moon ................. H01L 51/0011 |
| 2020/0259091 | A1* | 8/2020 | Chang ................ H01L 51/0011 |
| 2021/0020871 | A1* | 1/2021 | Wang ...................... H01L 51/56 |

FOREIGN PATENT DOCUMENTS

| CN | 107236927 A | 10/2017 |
| CN | 107829065 A | 3/2018 |
| CN | 108277473 A | 7/2018 |

* cited by examiner

*Primary Examiner* — Nduka E Ojeh
(74) *Attorney, Agent, or Firm* — Hauptman Ham, LLP (57) ABSTRACT

An OLED display screen and a manufacturing method for the OLED display screen are disclosed. During the whole process of evaporation of EL film layers, the opening preservation area in the display area would not be evaporated by any film layers such as EL function film layers, cathodes, etc., and therefore the reliability of the thin film encapsulation at the opening preservation area can be increased. Also a round opening is made at a position corresponding to the camera in the display area, such that the "forehead" of the mobile intelligent device becomes narrower, full display can be reached more closely than notch design, and a greater screen-to-body ratio can be realized.

12 Claims, 7 Drawing Sheets

(51) Int. Cl.
 *H01L 51/00* (2006.01)
 *H01L 51/52* (2006.01)
(52) U.S. Cl.
 CPC ...... *H01L 51/0011* (2013.01); *H01L 51/5253* (2013.01); *H01L 2227/323* (2013.01)

OLED DISPLAY SCREEN HAVING OPENING CORRESPONDING TO CAMERA MODULE AND MANUFACTURING METHOD THEREOF

FIELD OF INVENTION

The present invention relates to the technical field of display, especially to an organic light-emitting diode (OLED) display screen and a manufacturing method for the OLED display screen.

BACKGROUND OF INVENTION

Figure 1A:
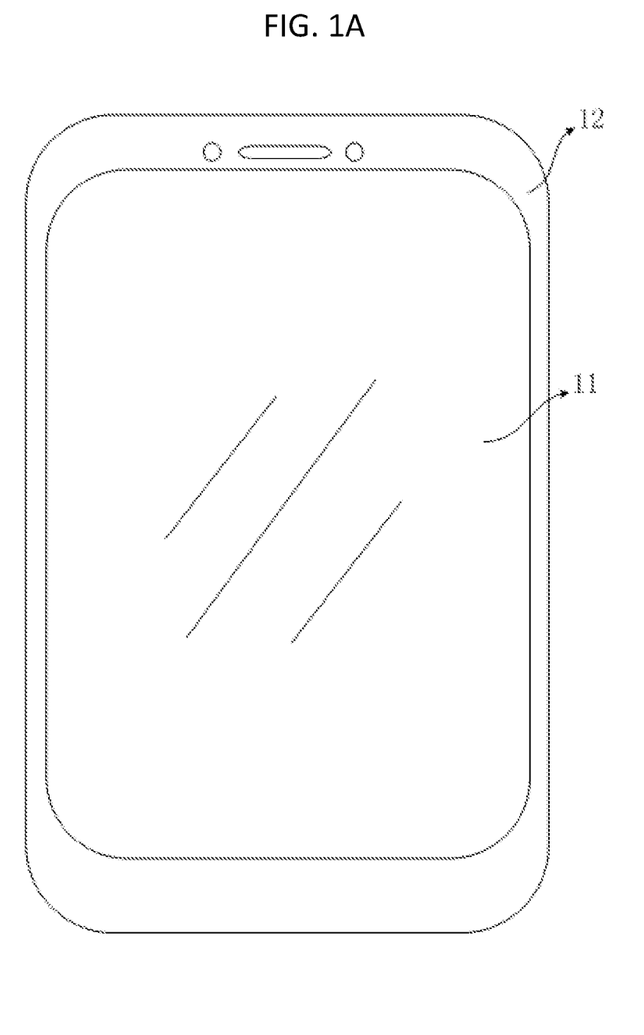
FIG. 1A is a schematic diagram of the borders surrounding the display screen of a conventional smart phone.
Figure 1B:
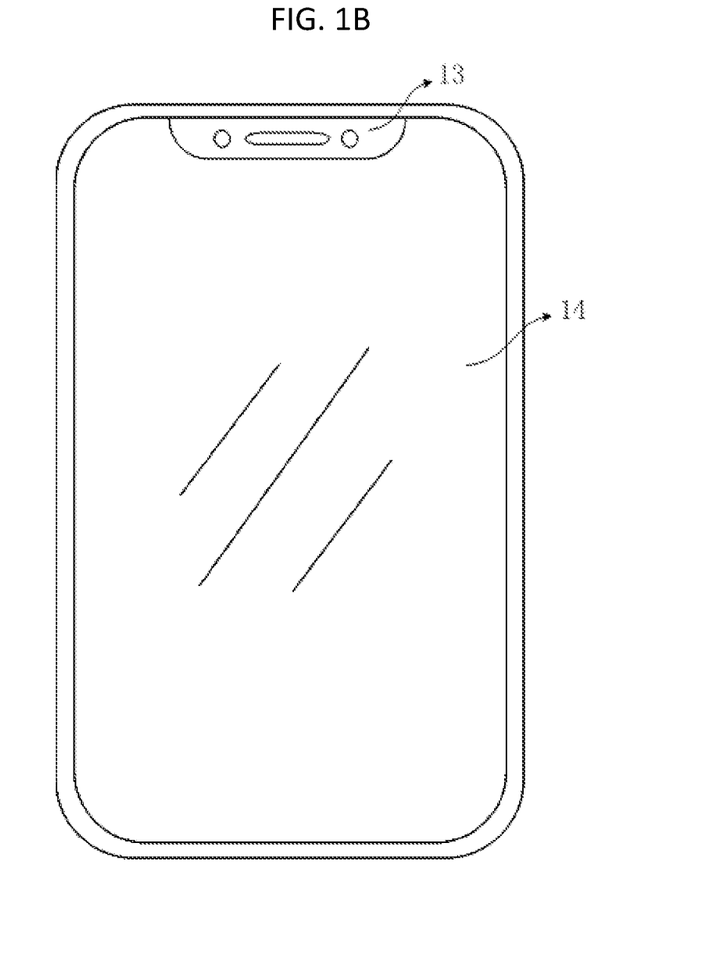
FIG. 1B is a schematic diagram of a U-shaped opening adopted by a conventional smart phone in the display area.

As shown in FIG. 1A, conventional smartphones include wider upper, lower, left and right borders 12 surrounding a display screen 11. With the existence of wider borders, the screen-to-body ratio of smartphones becomes lower and affects user experience. With the rapid development of smartphones toward full display, the screen-to-body ratio required becomes higher and higher and therefore designs such as notch appear, as shown in FIG. 1B, which makes a U-shaped opening 13 as space preserved for a front camera only at the "forehead" of a smartphone and leaves other space as display area 14.

Propelled by the rapid development of organic light-emitting diode (OLED) display technology in recent years, curved and flexible touch control display products appear swiftly in the market, and the update of the related technical fields also changes rapidly. OLED means diodes which can emit light through the injection and recombination of charge carriers by driving organic semiconductor materials and light-emitting materials under an electric field.

The electro luminescence (EL) device film layers of an OLED display screen are realized mainly through evaporation by using open masks. However, the conventional open masks limit evaporation areas by using one-piece masks with a corresponding opening, and therefore EL function film layers such as a hole injection layer (HIL), a hole transporting layer (HTL), an emitting layer (EL), an electron transporting layer (ETL) and an electron injection layer (EIL), and metal/organic/inorganic film layers such as cathodes, a capping layer and a LiF layer would be evaporated in the active area of the OLED display screen.

With the increased market need of ultra narrow border and full display designs in the display industry, the semiconductor encapsulation technology for it also progresses incessantly. Thin film encapsulation (TFE) is currently an encapsulation technology frequently used for OLED display screens. However, function film layers produced by evaporation are not allowed under the edge of a TFE layer due to the reliability requirement of the TFE, otherwise vapor, oxygen, etc. would penetrate into the interior of an OLED display screen after cutting through the cutting section of organic evaporation film layers and affect the reliability of the OLED display screen encapsulation.

Therefore, how to make sure that there are no film layers such as EL function/cathode/TFE film layers at the opening position in the OLED display screen and increase the encapsulation reliability of thin film encapsulation at the opening position in the OLED display screen becomes a problem desired to be solved.

SUMMARY OF INVENTION

An embodiment of the present invention is to provide an OLED display screen and a manufacturing method for the OLED display screen, such that the encapsulation reliability of thin film encapsulation at the opening position in the OLED display screen can be increased.

The present invention provides a manufacturing method for an OLED display screen that includes the following steps: providing a TFT array substrate, wherein an opening preservation area is disposed in a display area on the TFT array substrate; performing evaporation on the TFT array substrate separately by splicing two complementary open masks at the opening preservation area to form film layers of organic light emitting devices on the TFT array substrate outside the opening preservation area, wherein light emitting materials of the organic light emitting devices are evaporated by using fine metal masks, the fine metal masks do not have an opening at an area corresponding to the opening preservation area, and the border of splicing is located on a gap of a pixel circuit of the OLED display screen; performing thin film encapsulation to the TFT array substrate; making an opening on the opening preservation area.

The present invention further provides a manufacturing method for an OLED display screen that includes the following steps: providing a TFT array substrate, wherein an opening preservation area is disposed in a display area on the TFT array substrate; performing evaporation on the TFT array substrate separately by splicing two complementary open masks at the opening preservation area to form film layers of organic light emitting devices on the TFT array substrate outside the opening preservation area; performing thin film encapsulation to the TFT array substrate; making an opening on the opening preservation area.

The present invention further provides an OLED display screen, and the manufacturing method for the OLED display screen includes the following steps: providing a TFT array substrate, wherein an opening preservation area is disposed in a display area on the TFT array substrate; performing evaporation on the TFT array substrate separately by splicing two complementary open masks at the opening preservation area to form film layers of organic light emitting devices on the TFT array substrate outside the opening preservation area, wherein light emitting materials of the organic light emitting devices are evaporated by using fine metal masks, and the fine metal masks do not have an opening at an area corresponding to the opening preservation area; performing thin film encapsulation to the TFT array substrate; making an opening on the opening preservation area.

The embodiments of the present invention are to provide an OLED display screen. During the whole process of evaporation of EL film layers, the opening preservation area in the display area would not be evaporated by any film layers such as EL function film layers, cathodes, etc., and therefore the reliability of the thin film encapsulation at the opening preservation area can be increased. Also a round opening is made at a position corresponding to the camera in the display area, such that the "forehead" of the mobile intelligent device becomes narrower, full display can be reached more closely than notch design, and a greater screen-to-body ratio can be realized.

DESCRIPTION OF DRAWINGS

The present invention will become more fully understood from the following detailed description and the accompanying drawings which are given by way of illustration only and thus are not limitative of the present invention and wherein.

DETAILED DESCRIPTION OF PREFERRED EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature and may also include an embodiment in which the first feature is not right "beneath," "below," or "on bottom of" the second feature, or just means that the first feature has a sea level elevation less than the sea level elevation of the second feature.

The disclosure herein provides many different embodiments or examples for realizing different structures of the present disclosure. In order to simplify the disclosure of the present disclosure, components and settings of specific examples are described below. Of course, they are only examples and are not intended to limit the present disclosure. Furthermore, reference numbers and/or letters may be repeated in different examples of the present disclosure. Such repetitions are for simplification and clearness, which per se do not indicate the relations of the discussed embodiments and/or settings. Moreover, the present disclosure provides examples of various specific processes and materials, but the applicability of other processes and/or application of other materials may be appreciated by a person skilled in the art.

The organic light-emitting diode (OLED) display screen of the present invention makes a round hole at the position corresponding to a camera in the display area such that the "forehead" of an intelligent mobile equipment becomes even narrower and reaches full display more closely than notch design to realize a greater screen-to-body ratio.

The manufacturing method for an OLED display screen of the present invention performs evaporation on a thin film transistor (TFT) array substrate separately by splicing two complementary open masks at the opening preservation area to form the film layers of organic electro luminescence (EL) devices on the TFT array substrate outside the opening preservation area and makes sure that function film layers such as a hole injection layer (HIL), a hole transporting layer (HTL), an electron transporting layer (ETL) and an electron injection layer (EIL) and metal/organic/inorganic film layers such as cathodes, a capping layer and a LiF layer would not be evaporated in the opening preservation area during the evaporation process. By using fine metal masks (FMM) of little thickness and low coefficient of thermal expansion having small holes on them as masks to evaporate the EL materials (R/G/B EL materials) of the pixels in the OLED display screen, provided that the FMMs do not have an opening at the position corresponding to the opening preservation area, the EL materials can be prevented from being evaporated on the TFT array substrate. That is, during the whole evaporation process of EL film layers, film layers such as EL and cathodes would not be evaporated in the opening preservation area and therefore the reliability of the TFE at the position of the opening preservation area can be increased.

Figure 2:
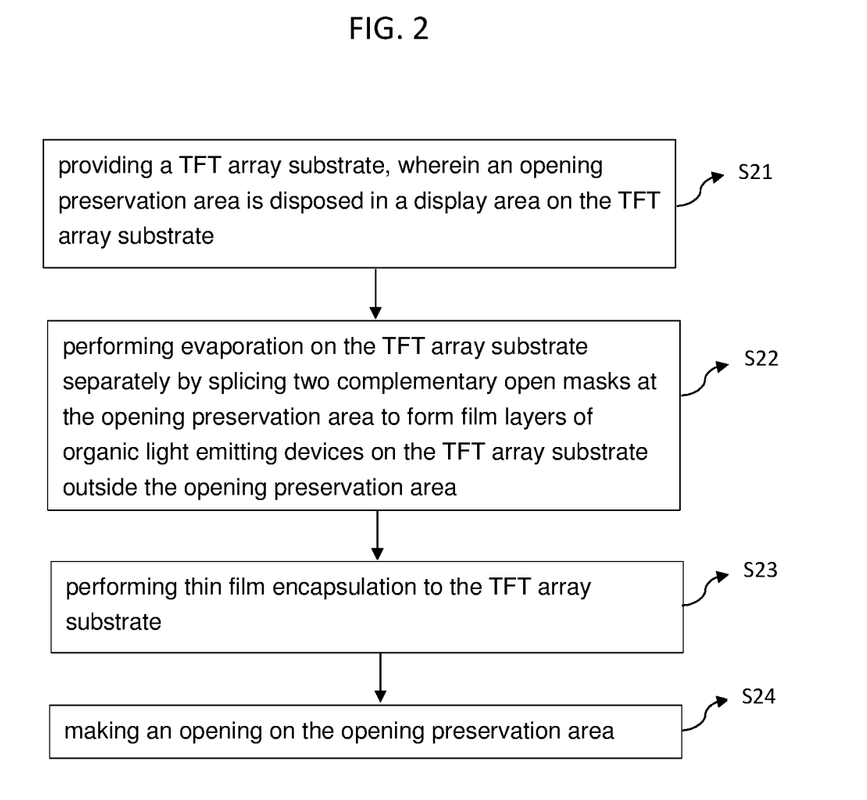
FIG. 2 is a flow chart of the manufacturing method for an organic light-emitting diode (OLED) display screen according to the present invention.
Figure 3:
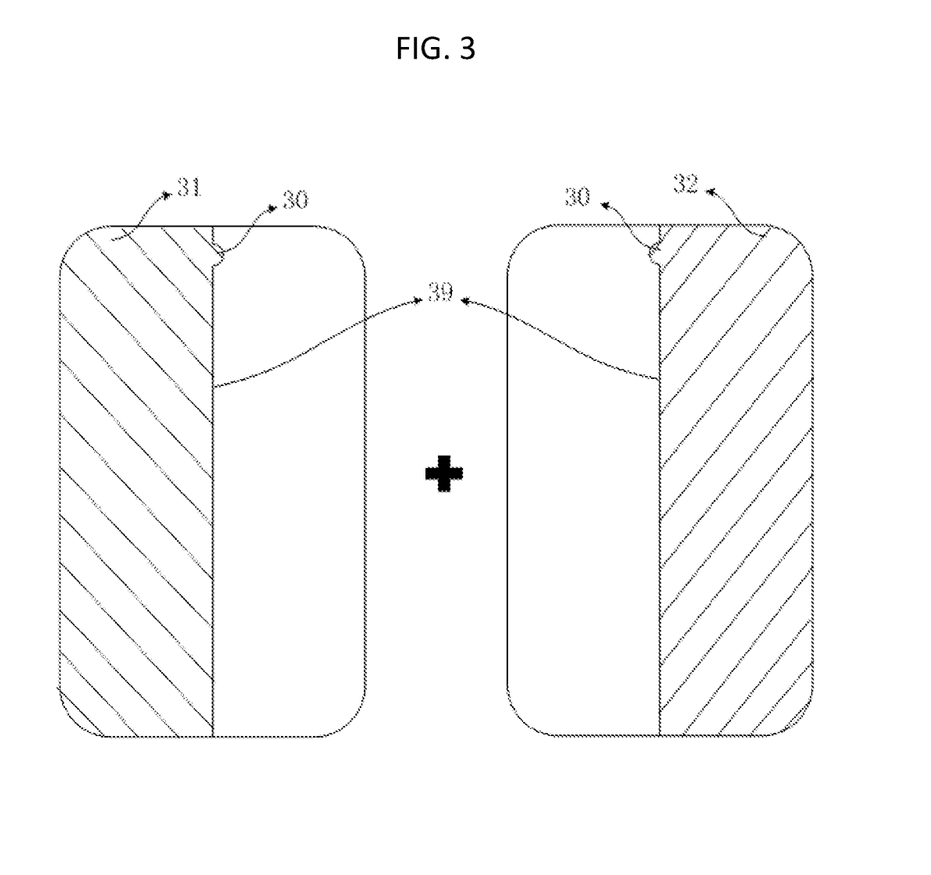
FIG. 3 is a schematic diagram of splicing two complementary open masks at the opening preservation area adopted by the OLED display screen according to the first embodiment of the present invention.
Figure 4:
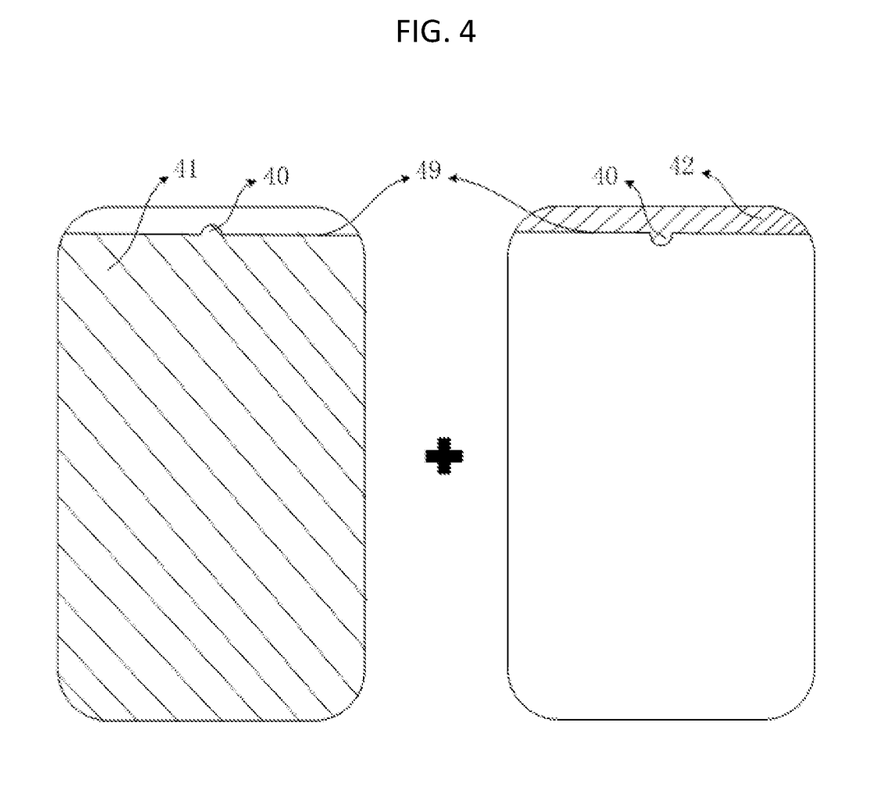
FIG. 4 is a schematic diagram of splicing two complementary open masks at the opening preservation area adopted by the OLED display screen according to the second embodiment of the present invention.
Figure 5:
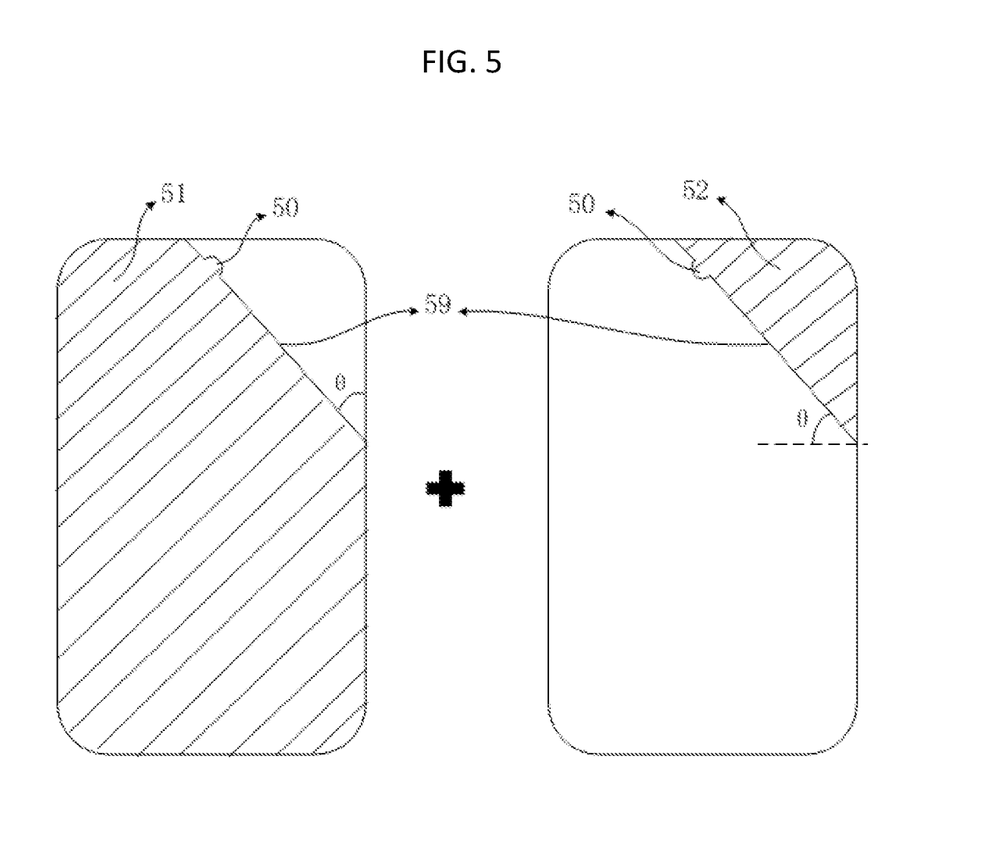
FIG. 5 is a schematic diagram of splicing two complementary open masks at the opening preservation area adopted by the OLED display screen according to the third embodiment of the present invention.

Referring to FIG. 2-FIG. 5, FIG. 2 is a flow chart of the manufacturing method for an OLED display screen according to the present invention, FIG. 3 is a schematic diagram of the OLED display screen when splicing two complementary open masks at the opening preservation area according to the first embodiment of the present invention, FIG. 4 is a schematic diagram of the OLED display screen when splicing two complementary open masks at the opening preservation area according to the second embodiment of the present invention, and FIG. 5 is a schematic diagram of the OLED display screen when splicing two complementary open masks at the opening preservation area according to the third embodiment of the present invention.

The manufacturing method for the OLED display screen includes the following steps: S21: providing a TFT array substrate, wherein an opening preservation area is disposed in a display area on the TFT array substrate; S22: performing evaporation on the TFT array substrate separately by splicing two complementary open masks at the opening preservation area to form film layers of organic light emitting devices on the TFT array substrate outside the opening preservation area; S23: performing thin film encapsulation to the TFT array substrate; S24: making an opening on the opening preservation area.

Regarding step S21: providing a TFT array substrate, wherein an opening preservation area is disposed in a display area on the TFT array substrate. Film layer structures except the film layers of light emitting devices are prepared on the TFT array substrate. For example, the TFT array substrate includes a stopper layer (M/B), a buffer layer, an active layer, a gate insulation layer, a gate layer, a dielectric insulation layer, a source and drain layer, a plane layer, anodes, etc., stacking one another in order on the substrate, and the present invention does not limit them. The opening preservation area is disposed in the display area on the TFT array substrate, and the film layers at the opening preservation area have been removed to form a preliminary opening.

Regarding step S22: performing evaporation on the TFT array substrate separately by splicing two complementary open masks at the opening preservation area to form film layers of organic light emitting devices on the TFT array substrate outside the opening preservation area. Referring to FIG. 2 and FIG. 3-FIG. 5, the present invention makes use of splicing two complementary open masks at the opening preservation area rather than conventional one-piece open masks having a corresponding opening on the display area. The two complementary open masks are spliced at the opening preservation area to perform evaporation of film layers (including EL function film layers such as HIL/HTL/ETL/EIL and metal/organic/inorganic film layers such as cathodes/capping layer/LiF) of organic light emitting devices on the TFT array substrate separately to make sure that during the whole evaporation process EL film layers would not be evaporated in the opening preservation area.

Splicing two complementary open masks at the opening preservation area includes: splicing two complementary open masks at the opening preservation area in a horizontal direction; or splicing two complementary open masks at the opening preservation area in a vertical direction; or splicing two complementary open masks having the same preset slant angle at the opening preservation area in a slant direction; wherein a widthwise direction of the OLED display screen is defined to be the horizontal direction, and a lengthwise direction of the OLED display screen is defined to be the vertical direction.

As shown in FIG. 3, in this embodiment, splicing two complementary open masks at the opening preservation area is particularly: splicing two complementary open masks 31, 32 at the opening preservation area 30 in a horizontal direction, that is, splicing together left and right portions. A widthwise direction of the OLED display screen is defined to be the horizontal direction X, and a lengthwise direction of the OLED display screen is defined to be the vertical direction Y. Advantageously, the border 39 of splicing is located on the gap of the pixel circuit of the OLED display screen, which can prevent optical and display abnormalities of the OLED display screen caused by uneven thickness of film layers at the border.

As shown in FIG. 4, in this embodiment, splicing two complementary open masks at the opening preservation area is particularly: splicing two complementary open masks 41, 42 at the opening preservation area 40 in a vertical direction, that is, splicing together upper and lower portions. A widthwise direction of the OLED display screen is defined to be the horizontal direction X, and a lengthwise direction of the OLED display screen is defined to be the vertical direction Y. Advantageously, the border 49 of splicing is located on the gap of the pixel circuit of the OLED display screen, which can prevent optical and display abnormalities of the OLED display screen caused by uneven thickness of film layers at the border.

As shown in FIG. 5, in this embodiment, splicing two complementary open masks at the opening preservation area is particularly: splicing two complementary open masks 51, 52 having the same preset slant angle θ at the opening preservation area 59 in a slant direction, that is, splicing in a slant direction at a certain angle. Advantageously, the border 59 of splicing is located on the gap of the pixel circuit of the OLED display screen, which can prevent optical and display abnormalities of the OLED display screen caused by uneven thickness of film layers at the border.

Advantageously, step S22 further includes: using fine metal masks to evaporate light emitting materials of the organic light emitting devices, wherein the fine metal masks do not have an opening at an area corresponding to the opening preservation area. By using FMMs with small holes on them and without an opening at the area corresponding to the opening preservation area to evaporate R/G/B light emitting materials in order to stop the light emitting materials being evaporated on the TFT array substrate, it can be ensured that during the whole evaporation process the EL film layers would not be evaporated in the opening preservation area.

Regarding step S23: performing thin film encapsulation to the TFT array substrate. Chemical vapor deposition (CVD) masks can be used to deposit inorganic film layers on the TFT array substrate prepared to be encapsulated, taking advantage of the vapor blocking effect of the inorganic film layers. It is noted that the inorganic film layers can be formed through CVD, they can also be formed through other methods such as chemical plating, sputter deposition and physical vapor deposition, and the present invention does not limit them.

In particular, the present invention performing thin film encapsulation to the TFT array substrate can be done through using one-piece chemical vapor deposition masks with a corresponding opening to deposit an inorganic film layer on the display area of the OLED display screen, and using dry etching to remove the inorganic film layer on the opening preservation area such that cracks possibly produced at the opening preservation area in the cutting process afterward can be prevented and encapsulation reliability can be maintained.

Advantageously, the present invention performing thin film encapsulation to the TFT array substrate can also be done through performing deposition of the inorganic film layer on the TFT array substrate separately by splicing two complementary chemical vapor deposition masks at the opening preservation area to accomplish the thin film encapsulation to the TFT array substrate and leave no deposition of the inorganic film layer on the opening preservation area. Splicing two complementary chemical vapor deposition masks at the opening preservation area includes: splicing two complementary chemical vapor deposition masks at the opening preservation area in a horizontal direction; or splicing two complementary open masks at the opening preservation area in a vertical direction; or splicing two complementary open masks having the same preset slant angle at the opening preservation area in a slant direction; wherein a widthwise direction of the OLED display screen is defined to be the horizontal direction, and a lengthwise direction of the OLED display screen is defined to be the vertical direction. By splicing two complementary chemical vapor deposition masks at the opening preservation area to deposit the inorganic film layer separately, the inorganic film layer would not be left on the opening preservation area. Advantageously, the border of splicing is located on the gap of the pixel circuit of the OLED display screen. The orientations of splicing are shown particularly as FIG. 3-FIG. 5 and repeat description is omitted.

Regarding step 24: making an opening on the opening preservation area. Laser cutting can be used to make an opening on the opening preservation area. Advantageously, the opening is a round opening. A round opening is opened at the position corresponding to the camera in the display area such that the "forehead" of the mobile intelligent device becomes narrower and full display can be reached more closely than notch design, and therefore a greater screen-to-body ratio can be realized.

Figure 6:
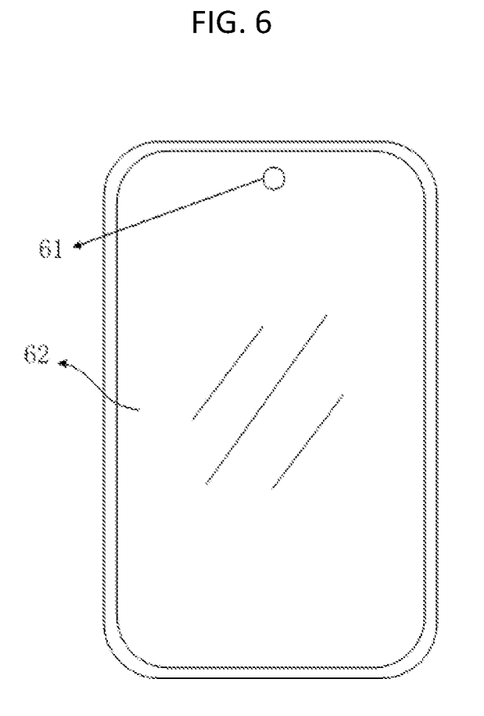
FIG. 6 is a schematic diagram of a round opening adopted by the OLED display screen in the display area according to the present invention.

The present invention further provides an OLED display screen manufactured by the manufacturing method for the OLED display screen in the foregoing. Referring to FIG. 6, which shows a schematic diagram of the OLED display screen adopting a round opening in the display area according to the present invention, and the OLED display screen is manufactured by the manufacturing method of the present invention. During the whole process of evaporation of EL film layers on the TFT array substrate of the OLED display screen, the area of the round opening would not be evaporated by any EL film layers, and therefore the reliability of the thin film encapsulation can be increased. The position (under the round opening 61) corresponding to the round opening 61 is the camera, and other space is all display area 62, such that the "forehead" of the mobile intelligent device becomes narrower, full display can be reached more closely than notch design, and a greater screen-to-body ratio can be realized.

What is claimed is:

1. A manufacturing method for an organic light-emitting diode (OLED) display screen comprising the following steps:
   providing a TFT array substrate, wherein an opening preservation area is disposed in a display area on the TFT array substrate;
   performing evaporation on the TFT array substrate separately by splicing two complementary open masks at the opening preservation area to form film layers of organic light emitting devices on the TFT array substrate outside the opening preservation area, wherein light emitting materials of the organic light emitting devices are evaporated by using fine metal masks, and the fine metal masks do not have an opening at an area corresponding to the opening preservation area;
   performing thin film encapsulation to the TFT array substrate;
   making an opening on the opening preservation area, wherein the opening is a round opening; and
   wherein the step of performing thin film encapsulation to the TFT array substrate comprises:
   using one-piece chemical vapor deposition masks with a corresponding opening to deposit an inorganic film layer on the display area of the OLED display screen, and using dry etching to remove the inorganic film layer on the opening preservation area; or
   performing deposition of the inorganic film layer on the TFT array substrate separately by splicing two complementary chemical vapor deposition masks at the opening preservation area to accomplish the thin film encapsulation to the TFT array substrate and leave no deposition of the inorganic film layer on the opening preservation area.

2. The manufacturing method as claimed in claim 1, wherein the means of splicing comprises:
   splicing two complementary open masks at the opening preservation area in a horizontal direction; or
   splicing two complementary open masks at the opening preservation area in a vertical direction; or
   splicing two complementary open masks having the same preset slant angle at the opening preservation area in a slant direction;
   wherein a widthwise direction of the OLED display screen is defined to be the horizontal direction, and a lengthwise direction of the OLED display screen is defined to be the vertical direction.

3. The manufacturing method as claimed in claim 1, wherein the means of splicing comprises:
   splicing two complementary chemical vapor deposition masks at the opening preservation area in a horizontal direction; or
   splicing two complementary open masks at the opening preservation area in a vertical direction; or
   splicing two complementary open masks having the same preset slant angle at the opening preservation area in a slant direction;
   wherein a widthwise direction of the OLED display screen is defined to be the horizontal direction, and a lengthwise direction of the OLED display screen is defined to be the vertical direction.

4. A manufacturing method for an organic light-emitting diode (OLED) display screen comprising the following steps:
   providing a TFT array substrate, wherein an opening preservation area is disposed in a display area on the TFT array substrate;
   performing evaporation on the TFT array substrate separately by splicing two complementary open masks at the opening preservation area to form film layers of organic light emitting devices on the TFT array substrate outside the opening preservation area;
   performing thin film encapsulation to the TFT array substrate;
   making an opening on the opening preservation area; and
   wherein the step of performing thin film encapsulation to the TFT array substrate comprises:
   using one-piece chemical vapor deposition masks with a corresponding opening to deposit an inorganic film layer on the display area of the OLED display screen, and using dry etching to remove the inorganic film layer on the opening preservation area; or
   performing deposition of the inorganic film layer on the TFT array substrate separately by splicing two complementary chemical vapor deposition masks at the opening preservation area to accomplish the thin film encapsulation to the TFT array substrate and leave no deposition of the inorganic film layer on the opening preservation area.

5. The manufacturing method as claimed in claim 4, wherein the step of performing evaporation on the TFT array substrate separately by splicing two complementary open masks at the opening preservation area to form film layers of organic light emitting devices on the TFT array substrate outside the opening preservation area further comprises:
   using fine metal masks to evaporate light emitting materials of the organic light emitting devices, wherein the fine metal masks do not have an opening at an area corresponding to the opening preservation area.

6. The manufacturing method as claimed in claim 4, wherein the means of splicing comprises:
   splicing two complementary open masks at the opening preservation area in a horizontal direction; or
   splicing two complementary open masks at the opening preservation area in a vertical direction; or
   splicing two complementary open masks having the same preset slant angle at the opening preservation area in a slant direction;
   wherein a widthwise direction of the OLED display screen is defined to be the horizontal direction, and a lengthwise direction of the OLED display screen is defined to be the vertical direction.

7. The manufacturing method as claimed in claim 4, wherein the means of splicing comprises:
  splicing two complementary chemical vapor deposition masks at the opening preservation area in a horizontal direction; or
  splicing two complementary open masks at the opening preservation area in a vertical direction; or
  splicing two complementary open masks having the same preset slant angle at the opening preservation area in a slant direction;
  wherein a widthwise direction of the OLED display screen is defined to be the horizontal direction, and a lengthwise direction of the OLED display screen is defined to be the vertical direction.

8. An organic light-emitting diode (OLED) display screen, wherein a manufacturing method for the OLED display screen comprises the following steps:
  providing a TFT array substrate, wherein an opening preservation area is disposed in a display area on the TFT array substrate;
  performing evaporation on the TFT array substrate separately by splicing two complementary open masks at the opening preservation area to form film layers of organic light emitting devices on the TFT array substrate outside the opening preservation area, wherein light emitting materials of the organic light emitting devices are evaporated by using fine metal masks, and the fine metal masks do not have an opening at an area corresponding to the opening preservation area;
  performing thin film encapsulation to the TFT array substrate;
  making an opening on the opening preservation area; and
  wherein the step of performing thin film encapsulation to the TFT array substrate comprises:
  using one-piece chemical vapor deposition masks with a corresponding opening to deposit an inorganic film layer on the display area of the OLED display screen, and using dry etching to remove the inorganic film layer on the opening preservation area; or
  performing deposition of the inorganic film layer on the TFT array substrate separately by splicing two complementary chemical vapor deposition masks at the opening preservation area to accomplish the thin film encapsulation to the TFT array substrate and leave no deposition of the inorganic film layer on the opening preservation area.

9. The OLED display screen as claimed in claim 8, wherein the means of splicing comprises:
  splicing two complementary open masks at the opening preservation area in a horizontal direction; or
  splicing two complementary open masks at the opening preservation area in a vertical direction; or
  splicing two complementary open masks having the same preset slant angle at the opening preservation area in a slant direction;
  wherein a widthwise direction of the OLED display screen is defined to be the horizontal direction, and a lengthwise direction of the OLED display screen is defined to be the vertical direction.

10. The OLED display screen as claimed in claim 8, wherein the means of splicing comprises:
  splicing two complementary chemical vapor deposition masks at the opening preservation area in a horizontal direction; or
  splicing two complementary open masks at the opening preservation area in a vertical direction; or
  splicing two complementary open masks having the same preset slant angle at the opening preservation area in a slant direction;
  wherein a widthwise direction of the OLED display screen is defined to be the horizontal direction, and a lengthwise direction of the OLED display screen is defined to be the vertical direction.

11. The OLED display screen as claimed in claim 8, wherein the opening is a round opening.

12. The OLED display screen as claimed in claim 11, wherein a camera module is located under the round opening.

* * * * *